United States Patent [19]

Göckler

[11] Patent Number: 5,068,817

[45] Date of Patent: Nov. 26, 1991

[54] NON-RECURSIVE HALF-BAND FILTER WITH COMPLEX VALUED COEFFICIENTS FOR COMPLEX INPUT AND OUTPUT SIGNALS

[75] Inventor: Heinz Göckler, Backnang, Fed. Rep. of Germany

[73] Assignee: ANT Nachrichtentechnik GmbH, Backnang, Fed. Rep. of Germany

[21] Appl. No.: 408,516

[22] PCT Filed: Jan. 16, 1988

[86] PCT No.: PCT/DE88/00020

§ 371 Date: Aug. 18, 1989

§ 102(e) Date: Aug. 18, 1989

[87] PCT Pub. No.: WO88/06381

PCT Pub. Date: Aug. 25, 1988

[30] Foreign Application Priority Data

Feb. 19, 1987 [DE] Fed. Rep. of Germany ....... 3705206

[51] Int. Cl.$^5$ ............................................. G06F 15/31
[52] U.S. Cl. ................................................. 364/724.16
[58] Field of Search ...................... 364/724.01, 724.12, 364/724.16

[56] References Cited

U.S. PATENT DOCUMENTS

| | | | |
|---|---|---|---|
| 4,020,333 | 4/1977 | Nussbaumer | 364/724.01 |
| 4,606,045 | 8/1986 | Miller | 364/724.11 |
| 4,736,392 | 4/1988 | Kammeyer et al. | 364/724.16 |

FOREIGN PATENT DOCUMENTS 0250926 1/1988 European Pat. Off. .

OTHER PUBLICATIONS

IEEE Trans. on Acoustics, Speech, and Signal Processing, Band ASSSP-22, nr. 4, Aug, 1974, Bellanger et al., "Interpolation Extrapolation and Reduction of Computation Speed in Digital Filters".

*Primary Examiner*—Dale M. Shaw
*Attorney, Agent, or Firm*—Spencer & Frank

[57] ABSTRACT

A non-recursive half-band filter having a filter length N includes a receiver unit for receiving a complex input signal having a real component and an imaginary component at a sampling frequency fA, where fA=1/T; and a processing and converting unit for processing and converting the received complex input signal into a complex output signal without changing the sampling frequency of the complex input signal. The processing and converting unit operate according to a function of h(l) and the equation:

$$s(kT) = s_1(kT) * h(l)$$
$$= s_{r1}(k) * h_r(l) - s_{i1}(k) * h_i(l) +$$
$$j[s_{r1}(k) * h_i(l) + s_{i1}(k) * h_r(l)]$$

and includes a modulating unit that modulates a pulse response h(l), where l=−(N−1)/2 to (N−1)/2 and is an odd filter length. As a result of this structure, it is possible to convert a complex input signal $s_{r1}(kT)+js_{i1}(kT)$ into a complex output signal $s(kT)=s_r(k)+js_i(k)$ by modulating its pulse reponse onto a complex carrier of a frequency equal to ¼ or ¾ of the sampling frequency fA, where the null phase of this frequency is an integer multiple of $\pi/2$ and is kept constant.

7 Claims, 5 Drawing Sheets (m=0;2 N=11)

(m=1;3; N=11)

(m=0;2 N=11)

(m=1;3; N=11)

NON-RECURSIVE HALF-BAND FILTER WITH COMPLEX VALUED COEFFICIENTS FOR COMPLEX INPUT AND OUTPUT SIGNALS

BACKGROUND OF THE INVENTION

The invention relates to a non-recursive half-band filter. Such filters have become known from the paper by Bellanger et al, entitled, "Interpolation, Extrapolation, and Reduction of Computation Speed in Digital Filters," published in IEEE Transactions on Acoustics, Speech and Signal Processing, Vol. ASSP-22, No. 4, August, 1974, pages 231–235.

The known half-band filters process real input signals into real output signals.

The German application P 3,621,737.9–35 discloses a non-recursive half-band filter which permits the conversion of a real input signal into a complex output signal or vice versa. In that process, the sampling rate was changed.

SUMMARY OF THE INVENTION

It is an object of the present invention to provide a non-recursive half-band filter that makes it possible to convert a complex input signal into complex output signal in an inexpensive manner.

This is accomplished by a non-recursive half-band filter having a filter length N, and including: at least one input and an output, the input for receiving a complex input signal $s_i(kT)$ having a real component $s_{rl}$ and an imaginary component $s_{il}$ at a sampling frequency fA, where fA =1/T; and means for processing and converting the received complex input signal $s_i(kT) = js_{il}$ into a complex output signal s(kT), where k is a running index, without changing the sampling frequency, the processing and converting means operating according to a function of h(l) and the equation:

$$s(kT) = s_1(kT) * h(l)$$
$$= s_{rl}(k) * h_r(l) - s_{il}(k) * h_i(l) +$$
$$j[s_{rl}(k) * h_i(l) + s_{il}(k) * h_r(l)]$$

and including means for modulating a pulse response h(l), where $l = -(N-1)/2$ to $(N-1)/2$ and N is an odd filter length, onto a complex carrier at a frequency of $\pm\frac{1}{4}$ of the sampling frequency to yield:

$$h(l) = h(l) \cdot e^{j(\pm 2\Pi l fA/4fA + \phi 0)} = j^{\pm 1} \cdot e^{j\phi 0} \cdot h(l)$$

wherein the null phase $\phi 0$ of this frequency is an integer multiple m of $\pi/2$.

Another aspect of the invention is provided by a non-recursive half-band filter having a processing and converting means with first partial filter means for generating a real component $s_{rl}(kT)$ of a complex output signal and second partial filter means for generating an imaginary component $s_{il}(kT)$ of the complex output signal. In this inventive filter, each partial filter means includes means for weighting the real and imaginary components of a complex input signal with values equal to a function of h(l); a chain of (N-31 1)/2 delay members having a delay time of 2T and a center delay member divided into two members where each divided member has a delay time of T; and means for forming a plurality of difference signals wherein the forming means of the first partial filter means and the forming means of the second partial filter means respectively feed a weighted real component and a weighted imaginary component to the first delay member of its respective chain of delay members and substract the respective weighted component from the output signal of the last delay member of the respective chain to respectively form a difference signal furnishing the real component $s_{rl}(kT)$ of the complex output signal and the imaginary component $s_{il}(kT)$ of the complex output signal. In addition, the weighting means weights additional momentary values of the filter input signal with a value equal to other functions of h(l) of the pulse response and the forming means adds the additional weighted values to a transversal signal of the chain of delay members at further points. The weighting means of the first partial filter means and the weighting means of the second partial filter means further weight the imaginary component and the real component, respectively of the complex input signal with a value equal to the function h(O) and feed the respective weighted component into the center delay member of the respective chain.

The non-recursive half-band filter according to the invention permits the conversion of complex digital input signals into complex digital output signals without a change in sampling frequency. This relatively inexpensive half-band filter is thus suitable as a digital pre-filter or post-filter for digital systems employed to process complex signals and as digital partial filters in an arrangement of anti-aliasing filters for band limitation while complying with the sampling theorem. The advantage of the half-band filter lies in its linear phase and simultaneously its low cost.

BRIEF DESCRIPTION OF THE DRAWINGS

There now follows a description with reference to the accompanying drawing figures in which.

DESCRIPTION OF THE PREFERRED EMBODIMENT

Figure 1:
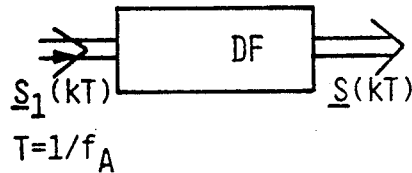
FIG. 1 is a block diagram for the digital filter according to the invention.

In FIG. 1, the complex input signal $s_i(kT)$ is applied, without changing the sampling rate, to a digital half-band filter DF which generates therefrom the complex output signal s(kT).

Figure 2A:
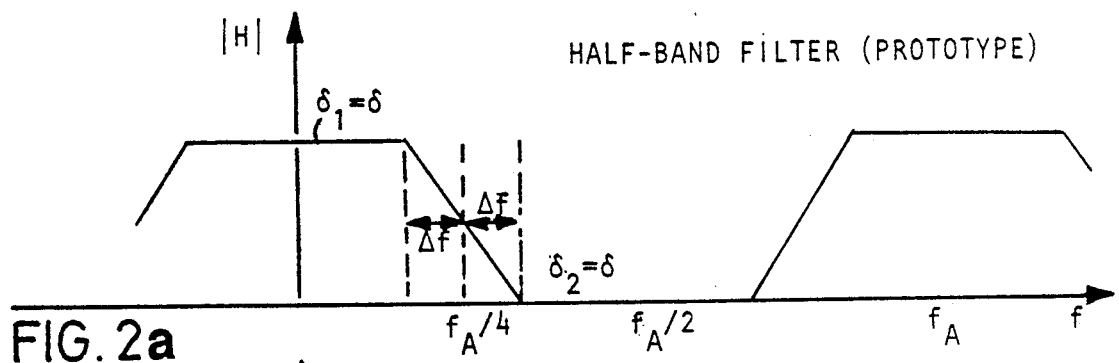
FIGS. 2a to 2c depict several amplitude responses of half-band filters plotted over frequency.

The amplitude frequency response of a prototype half-band filter is shown in FIG. 2a; the pass band of this filter extends from $-fA/4 + \Delta f$ to $+fA/4 -66 f$ (half value), and its stop band also has a width of $fA/2 - 2\Delta f$. It is a further characteristic of the half-band filter that the transition from the stop band to the pass band is steady and takes place over a width of 2 f. This transition range is symmetrical to fA/4. A further characteristic of the half-band filter is that its ripple in the pass band and in the stop band is identical, namely ⊕1 =⊕2 =⊕. In such a filter, there results a pulse response h(l) where l=0 to N−1 and the filter length N is odd, and it follows that every second value is identical to zero. With the exception of the central main value (see FIG. 2, page 233, in the above-cited paper by Bellanger et al).

Figure 2B:
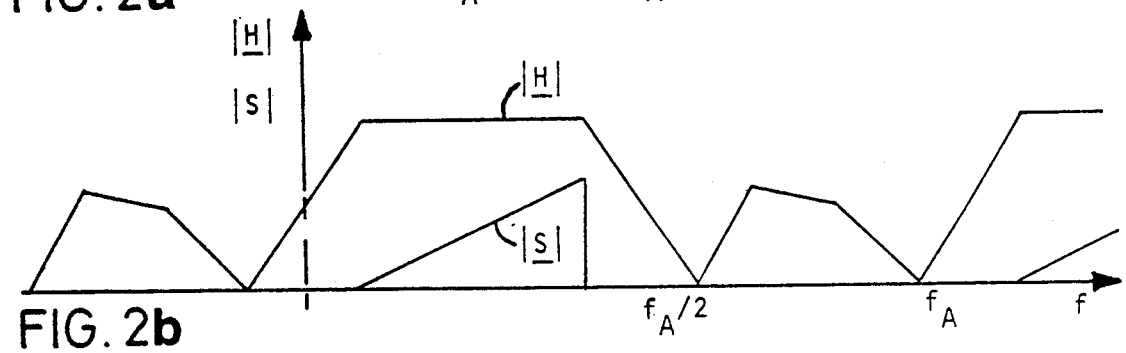
Figure 2C:
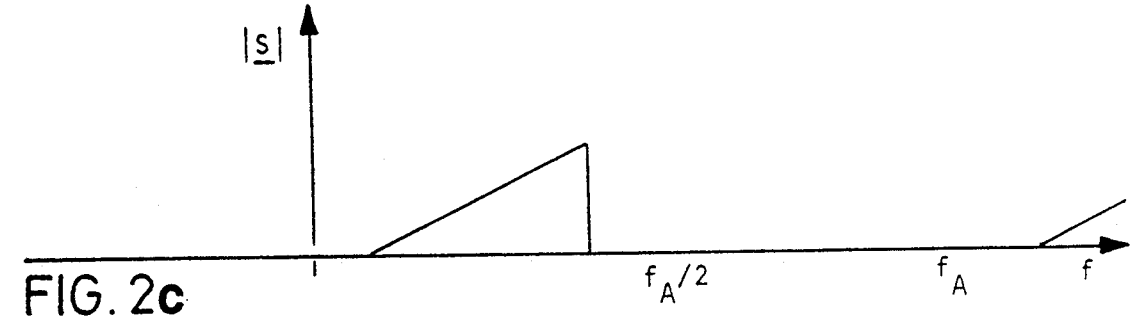

FIG. 2b shows the frequency response $|H|$. It can be seen that this frequency response has been shifted to the right by the frequency fA/4 relative to the frequency response of the prototype half-band filter. In addition, FIG. 2b shows the spectrum $|S_151|$ of a complex input signal $s_1(kT)$ sampled at the sampling frequency fA has been inserted; because of sampling with fA, this input signal is periodically repeated in frequency ranges [m·fA, (m+1) fA], where m =..., −1, 0, +1, .... Thus the half-band filter according to the invention will suppress the spectral components of $s_f(kT)$ between fA/2 and fA and of course all its repetitions.

At this point, it should be noted that the other spectral component of the complex input signal $s_f(kT)$ is obtained at the output of the half-band filter if the frequency response of the prototype half-band filter according to FIG. 2a is shifted by −fA/4 or, equivalently, by +3fA/4.

Figure 3:
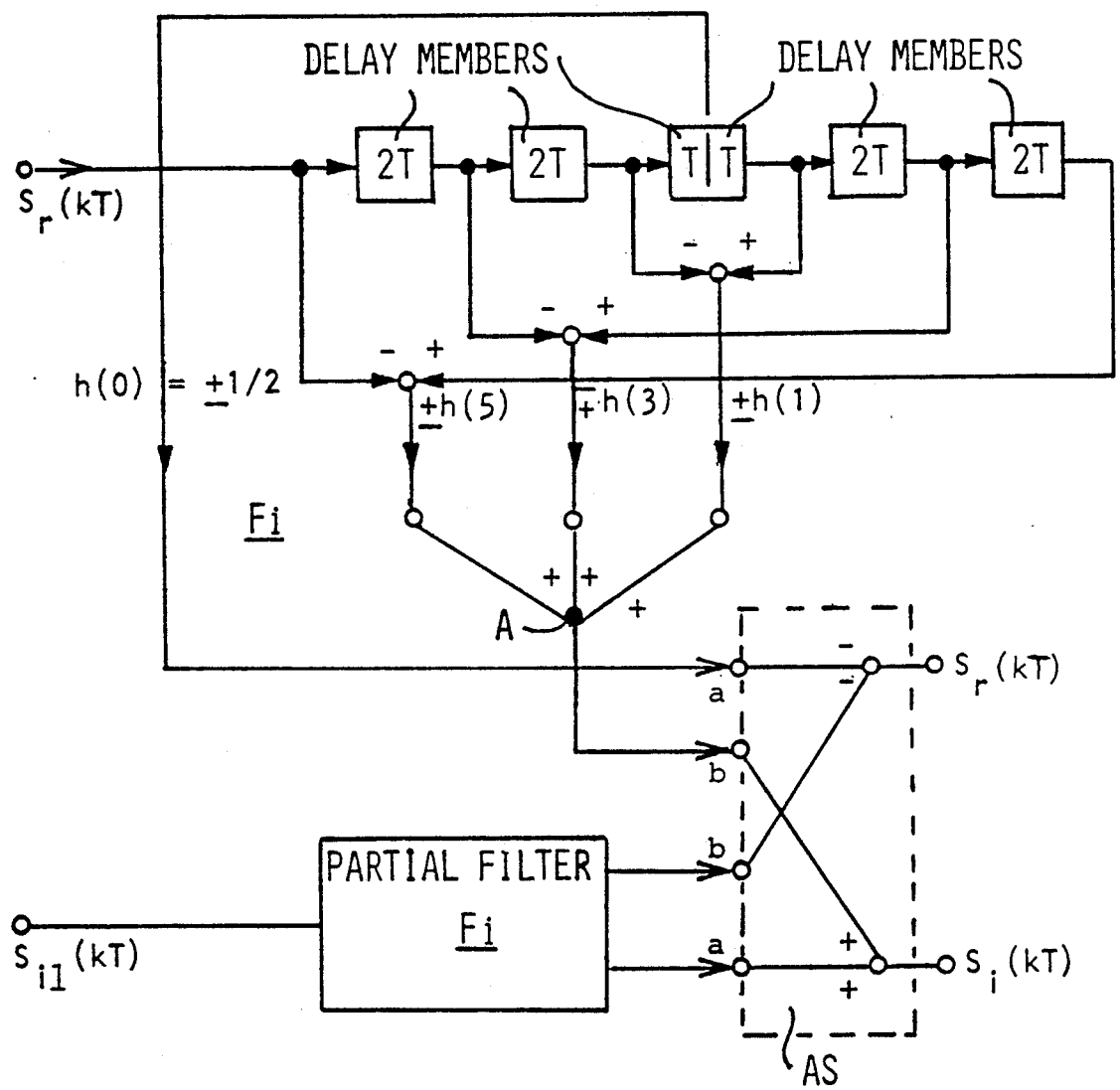
FIGS. 3 and 4 show particularly favorable schematic circuit variations of the half-band filter according to the invention.

FIG. 3 now shows a more detailed embodiment of a half-band filter according to the invention.

Figure 4:
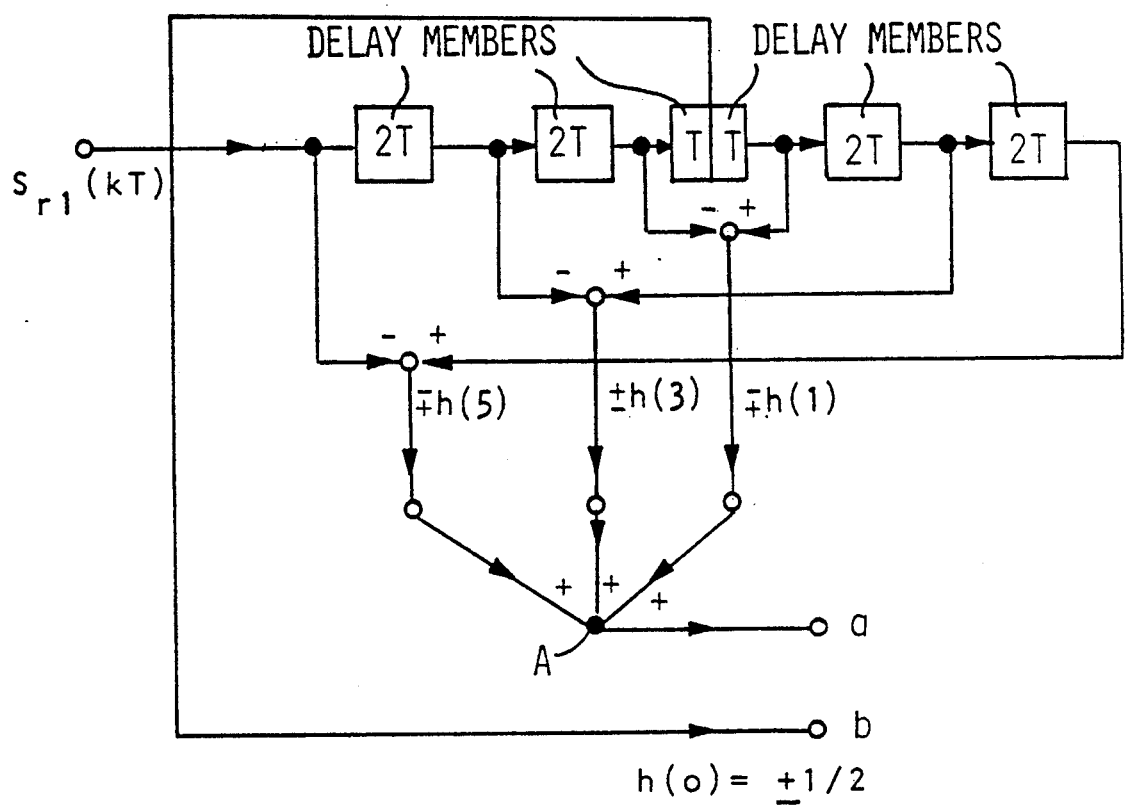

Both FIG. 3 and FIG. 4 show, as an example, a realization for a filter length of N =11 including a chain of six delay members, four delay members 2T having a delay time of 2T and two delay members T, disposed symmetrically between the four delay members, having a delay time of T.

FIG. 3 shows the complete half-band filter including the two identical partial filters Fi, with the upper filter serving to process the real component $s_{rf}(kT)$ and the lower filter to process the imaginary component $s_{if}(kT)$ of the complex input signal $s_f(kT)$. The pairs of output signals at terminals a and b are interconnected according to:

$$s(kT) = s_1(kT) * h(l)$$
$$= s_{r1}(k) * h_r(l) - s_{i1}(k) * h_i(l) +$$
$$j|s_{r1}(k) * h_i(l) + s_{i1}(k) * h_r(l)|$$

This interconnection occurs in an output circuit AS including a difference and sum forming member, and this output circuit furnishing the complex output signal $s(kT) = s_r(k) + j s_i(k)$.

FIG. 3 shows two realizations, namely for a modulation phase angle $\phi 0 = 0$ and $\phi 0 = \pi$ corresponding to m =0 and m =2. The output signal of the delay members of the left half of the chain is weighted (multiplied) with h(0) =½ and thus yields a contribution to the real component $s_r(kT)$ of the output signal. For m =2 weighting occurs with −½. The further processing in the delay chain now takes place in such a way that (N+1)/4 =3 difference signals are formed:

the first difference signal equals the input signal of the first delay member minus the output signal of the last delay member;

the second difference signal equals the input signal of the second delay member minus the output signal of the penultimate delay member; and the third difference signal equals the input signal of the third delay member minus the output signal of the third last, i.e. the middle, delay member.

Next, these difference signals are weighted (multiplied) and summed by an adder A and thereby yield a contribution to the imaginary component of output signal s(kT). The weighting is effected according to the following tables.

Examples for N=11 and h(−l)=h(l), where l=0, 1, ..., 5, corresponding to the prototype half-band filter according to the frequency response curve of FIG. 2a:

TABLE 1

| m = 0 (for m = 2 in each case with the opposite sign for the complex coefficients h = Re(h) + jJm(h)) | | | | | | |
|---|---|---|---|---|---|---|
| l | −5 | −3 | −1 | 0 | 1 | 3 | 5 |
| Re(h) | 0 | 0 | 0 | h(0) | 0 | 0 | 0 |
| Jm(h) | −h(5) | h(3) | −h(1) | 0 | h(1) | −h(3) | h(5) |

TABLE 2

| m = 1 (for m = 3 in each case with the opposite sign for the complex coefficients) | | | | | | |
|---|---|---|---|---|---|---|
| l | −5 | −3 | −1 | 0 | 1 | 3 | 5 |
| Re(h) | h(5) | −h(3) | h(1) | 0 | −h(1) | h(3) | −h(5) |
| Jm(h) | 0 | 0 | 0 | h(0) | 0 | 0 | 0 |

The realization according to FIG. 4 takes place in the same manner as that in FIG. 3; the sole difference is in the other null phase value $\phi 0 = m \cdot \pi/2$ where m =1 and 3, the only consequence of which is a different weighting.

Figure 5:
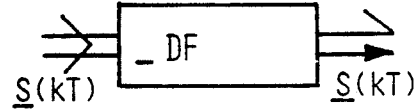
FIG. 5 is a block diagram for a transposed, inversely operated half-band filter, according to the invention, used to process a complex input signal into a complex output signal.
Figure 6:
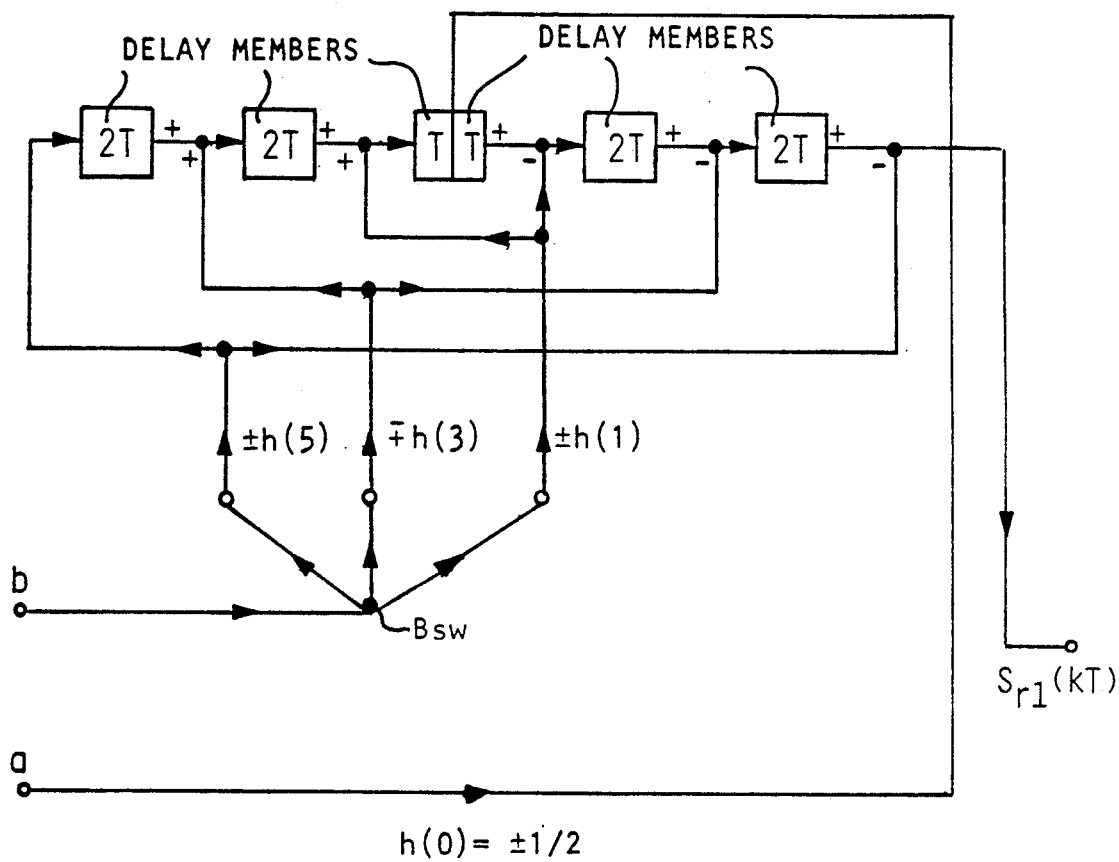
FIG. 6 shows, in schematic, circuit details of the filter shown in FIG. 5, with this circuit having been developed by transposition from that of FIG. 3, i.e., by reversing all directions indicated by arrows and replacing a branching switch for an adder and vice versa, and by replacing a demultiplexer by a multiplexer.
Figure 7:
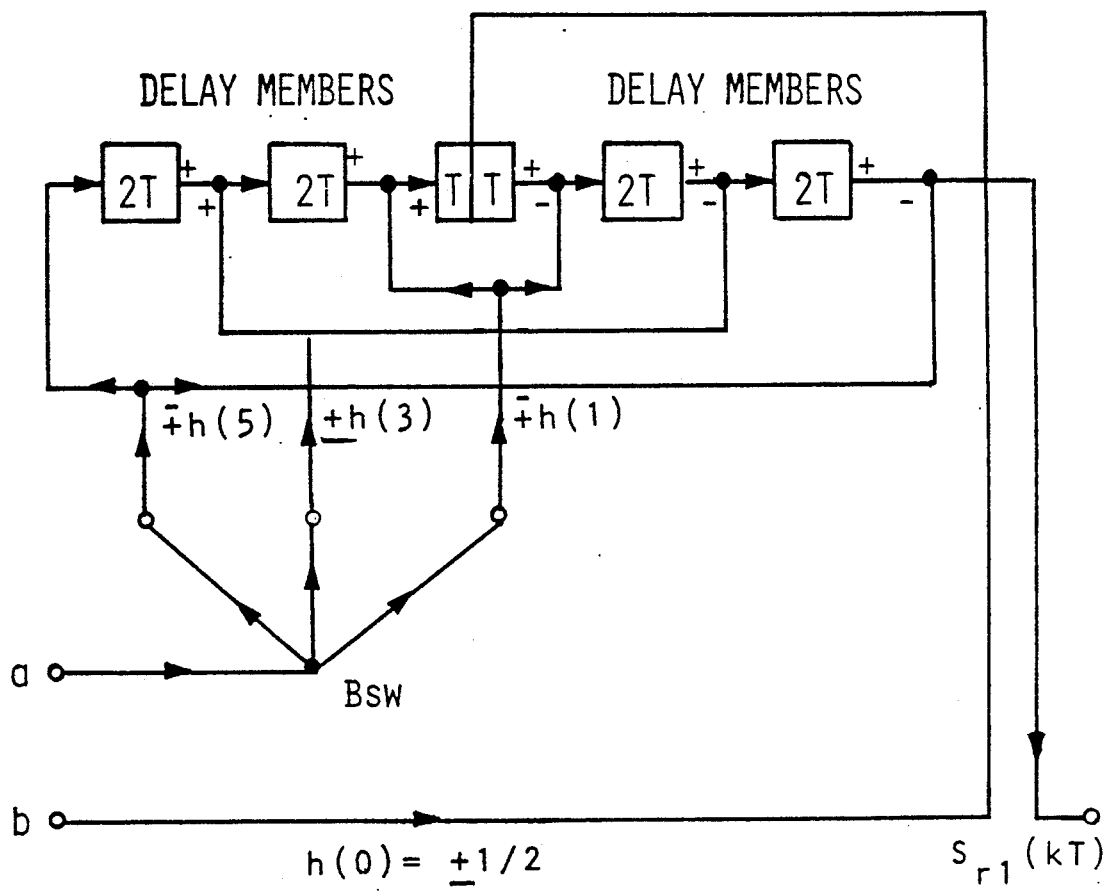
FIG. 7 shows, in schematic, another circuit arrangement of the filter of FIG. 5, this circuit arrangement being developed.

FIG. 5 shows the block circuit diagram for the reversed use of the half-band filter of FIG. 1, also for the generation of a complex output signal from a complex input signal. To this end, there must be a transposition of the circuits presented above, which results in a reversal of the directions of all arrows and the replacement of a branching switch BSW for an adder A and vice versa. In a corresponding manner, the circuit embodiment of FIG. 6 is derived from FIG. 3 and the circuit of FIG. 7 is derived from FIG. 4.

I claim:

1. A non-recursive half-band filter having a filter length N, comprising:

at least one input and an output, said input for receiving a complex input signal $s_f(kT)$ having a real component $s_{rf}$ and an imaginary component $s_{if}$ at a sampling frequency fA, where fA =1/T; and means for processing and converting the received complex input signal $s_f(kT) = s_{rf} = j s_{if}$ into a complex output signal s(kT), where K is a running index, without changing the sampling frequency, said processing and converting means operates according to the equation:

$$s(kT) = s_1(kT) * h(l)$$
$$= s_{r1}(k) * h_r(l) - s_{i1}(k) * h_i(l) +$$
$$j|s_{r1}(k) * h_i(l) + s_{i1}(k) * h_r(l)|$$

and includes means for modulating a pulse response h(l), where l = −(n−1)/2 to (N−1)/2 and N is an odd filter length, onto a complex carrier at a frequency of ±¼ of the sampling frequency to yield:

$$h(l) = h(l) \cdot e^{j(\pm 2\pi l f A/4 f A + \phi 0)} = j^{\pm l} \mathbf{19} \, e^{j \phi 0} \cdot h(l)$$

where the null phase $\phi 0$ of this frequency is an integer multiple m of $\pi/2$ ($100\ 0 = m \cdot \pi/2$ where $m = 0,1,2,3...$) wherein said modulating means includes, for real component inputs and imaginary component inputs, a respective chain of $(N-1)/2$ delay members having a center delay member where each sample of the real component and the imaginary component of the input signal $s_i(kT)$ is routed into the respective chain of $(N-1)/2$ delay members having delay times of $2T$, with the center delay member being divided into two members having a delay time of $T$; respective difference signal forming means for subtracting from the output signal of the last delay member of the respective chain the input signal of the first delay member of the respective chain to form a first respective difference signal, subtracting from the output signal of the penultimate delay member of the respective chain the input signal of the second delay member of the respective chain to form a second respective difference signal, subtracting from the output signal of the third to last delay member of the respective chain the input signal of the third delay member of the respective chain to form a third respective difference signal, and so on until the output signal of each delay member is processed; respective weighting means for weighting said respective difference signals by a value equal to a function of the pulse response $h(l)$; respective means for summing the respective weighted difference signals via an adder to yield either a term of the real or the imaginary component of the filter output signal $s(kT)$; and respective means for outputting an output signal from the center delay member of the respective chain, after a delay of $T \cdot (N-1)/2$, said output signal being weighted with a value equal to a function of $h(0)$, which results in a term of the imaginary component or the real component of the filter output signal $S(kT)$.

2. A non-recursive half-band filter according to claim 1, wherein $N = 11$ and $m = 1$, and said weighting means weights the first difference signal with a value equal to the function $-h(5)$, the second difference signal with a value equal to the function $h(3)$ and the third difference a signal with a value equal to the function $-h(1)$; and $h(0) = \frac{1}{2}$.

3. A non-recursive half-band filter according to claim 1, wherein $N = 11$ and $m = 3$, and said weighting means weights the first difference signal with a value equal to the function $h(5)$, the second difference signal with a value equal to the function $-h(3)$, and the third difference signal with a value equal to the function $h(1)$; and $h(0) = -\frac{1}{2}$.

4. A non-recursive half-band filter according to claim 1, wherein $N = 11$ and $m = 0$, wherein said weighting means weights the first difference signal with a value equal to the function $h(5)$, the second difference signal with a value equal to the function $-h(3)$, and the third difference signal with a value equal to the function $h(1)$; and $h(0) = \frac{1}{2}$.

5. A non-recursive half-band filter according to claim 1, wherein $N = 11$ and $m = 2$, wherein said weighting means weights the first difference signal with a value equal to the function $-h(5)$, the second difference signal with a value equal to the function $h(3)$, and the third difference signal with a value equal to the function $-h(1)$; and $h(0) = -\frac{1}{2}$.

6. A non-recursive half-band filter having a filter length N, comprising:

at least one input and an output, said input for receiving a complex input signal $s(kT)$ including a real component and an imaginary component, where k is a running index; and means for processing and converting the received complex input signal into a complex output signal $s_f(kT)$, while maintaining a sampling frequency $fA = 1/T$, said processing and converting means having means for modulating a pulse response $h(l)$ with reference to the sampling frequency fA, where $l = -(-1)/2$ to $(N-1)/2$ and the filter length N is odd, onto a complex carrier at a frequency of $\pm fA/4$ to yield:

$$h'(l) = h(l) \cdot e^{(\pm 2\pi l fA/4fA = \phi 0)} = j^{\pm l} \cdot h(l)$$

wherein the null phase $\phi 0$ of this frequency is an integer multiple m of $\pi/2$ ($\phi 0 = 0, 1, 2, 3, ...$), said modulating means including first partial filter means for generating a real component $s_r(kT)$ of said complex output signal and second partial filter means for generating an imaginary component $s_{ii}(kT)$ of said complex output signal, each partial filter means comprising:

means for weighting the real and imaginary components of said received complex input signal with values equal to a function of $h(l)$;

a chain of $(N-1)/2$ delay members having a delay time of $2T$ and a center delay member divided into two members, each divided member having a delay time of $T$, said chain of delay members and said center delay member of said first filter means respectively receiving weighted real components and a weighted imaginary component of said input signal, said chain of delay members and said center delay member of said second filter means respectively receiving weighted imaginary components and a weighted real component of said input signal; and means for forming a plurality of difference signals wherein said forming means of said first partial filter means and said forming means of said second partial filter means respectively feed a weighted real component and a weighted imaginary component to the first delay member of its respective chain and substract the respective weighted component from the output signal of the last delay member of the respective chain to form a difference signal respectively furnishing the real component $s_r(kT)$ of the complex output signal and the imaginary component $s_{ii}(kT)$ of the complex output signal; said weighting means weights additional momentary values of the filter input signal with a value equal to other functions of $h(l)$ of the pulse response and said forming means adds the additional weighted values to a transversal signal of the chain of delay members at further points; and the weighting means of said first partial filter means and the weighting means of said second partial filter means weight the imaginary component and the real component, respectively of the complex input signal with a value equal to the function $h(O)$ and feed the respective weighted component into the center delay member of the respective chain.

7. A non-recursive half-band filter according to claim 6, wherein $m = 0$ and 2, respectively, and $N = 11$, and the weighting means weights the additional momentary values of the real component $s_r(kT)$ and of the imaginary component $s_i(kT)$, respectively, of the complex filter input signal and the forming means adds the weighted values to the transversal signal as follows:

at the input of the first delay member of the chain, with a value equal to the function $\pm h(5)$;

at the input of the second delay member of the chain with a value equal to the function $\pm h(3)$;

at the input of the third delay member of the chain, with a value equal to the function $\pm h(1)$;

at the input of the penultimate delay member of the chain, with a value equal to the function $\pm h(1)$;

at the input of the last delay member of the chain, with a value equal to the function $\pm h(3)$; and at the output of the last delay member of the chain, with a value equal to the function $\pm h(5)$; and $h(0) = \pm \frac{1}{2}$.

* * * * *